(12) United States Patent
Ito et al.

(10) Patent No.: US 7,517,721 B2
(45) Date of Patent: Apr. 14, 2009

(54) LINEAR ACTUATOR AND APPARATUS UTILIZING THE SAME

(75) Inventors: Kenichi Ito, Zama (JP); Tadahiro Nakayama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/871,434

(22) Filed: Oct. 12, 2007

(65) Prior Publication Data

US 2008/0204174 A1 Aug. 28, 2008

(30) Foreign Application Priority Data

Feb. 23, 2007 (JP) ............................. 2007-043795
Jul. 10, 2007 (JP) ............................. 2007-180951

(51) Int. Cl.
*H01F 7/08* (2006.01)
*H01L 21/00* (2006.01)
(52) U.S. Cl. ...................... 438/106; 335/222; 335/229
(58) Field of Classification Search ................. 335/222, 335/229–234; 438/106
See application file for complete search history.

(56) References Cited

U.S. PATENT DOCUMENTS 4,808,955 A * 2/1989 Godkin et al. .............. 335/222

FOREIGN PATENT DOCUMENTS

JP 2004-08892 3/2004

* cited by examiner

*Primary Examiner*—Ramon M Barrera
(74) *Attorney, Agent, or Firm*—Pearne & Gordon LLP

(57) ABSTRACT

A linear actuator includes a first inner permanent magnet joined to an inner yoke, a second inner permanent magnet joined to the inner yoke, an outer yoke, a member interconnecting the outer and inner yokes, a first outer permanent magnet joined to an inner surface of the outer yoke, a second outer permanent magnet joined to an inner surface of the outer yoke, a first armature coil inserted into a gap between the first inner and outer permanent magnets, and a second armature coil inserted into another gap between the first inner and outer permanent magnets. The inner yoke includes an inner thicker portion axially opposed to the inner permanent magnets and having a larger radial thickness than a remaining portion. The outer yoke includes an outer thicker portion axially opposed to the first and second outer permanent magnets and having a larger radial thickness than a remaining portion.

6 Claims, 9 Drawing Sheets

LINEAR ACTUATOR AND APPARATUS UTILIZING THE SAME

CROSS-REFERENCE TO RELATED APPLICATIONS

This application is based upon and claims the benefit of priority from the prior Japanese Patent Application Nos. 2007-43795 filed on Feb. 23, 2007 and 2007-180951 filed on Jul. 10, 2007, the entire contents of which are incorporated herein by reference.

BACKGROUND OF THE INVENTION

1. Field of the Invention

The present invention relates to a linear actuator obtaining a linear thrust force by electromagnetic force and an apparatus utilizing the linear actuator.

2. Description of the Related Art

One of types of linear actuators is constructed so as to dispose an armature coil in an electric field generated by a permanent magnet. Electric current is supplied to the armature coil so that linear thrust is obtained by electromagnetic force. FIG. 13 illustrates a conventional linear actuator of the above-described type. This actuator is disclosed by JP-A-2004-88992. The convention linear actuator comprises a cylindrical inner and outer yokes 101 and 102. The inner yoke 101 is inserted inside the outer yoke 102 so as to be axially movable. The inner yoke 101 has an outer periphery to which three cylindrical permanent magnets 103 are axially joined. Each permanent magnet 103 includes an inner peripheral portion which is magnetized so as to have either south pole or north pole. Each permanent magnet 103 further includes an outer peripheral portion which is magnetized so as to have either north pole or south pole. The permanent magnets 103 are arranged in an axial sequence of north pole, south pole and north pole in the inner peripheral portions of the magnets and in an axial sequence of south pole, north pole and south pole in the outer peripheral portions of the magnets. Three cylindrical armature coils 104 are inserted in a space defined between the outer peripheral surfaces of the permanent magnets 103 and an inner peripheral surface of the outer yoke 102. The armature coils 104 are mechanically interconnected by the outer yoke 102. Each armature coil 104 is placed in magnetic field. Electric current is applied to each armature coil 104 so that downward or upward thrust is imparted to the outer yoke 102. The permanent magnets 103 and the armature coils 104 are arranged in three stages in the above-described conventional linear actuator. As a result, an axial dimension or the height of the actuator is increased. Moreover, since the axially adjacent permanent magnets 103 are in mechanical contact with each other, magnetic flux loops directly between the axially adjacent permanent magnets 103. Accordingly, an amount of magnetic flux interlinking the armature coils 104 is reduced such that the thrust of the actuator is also reduced.

SUMMARY OF THE INVENTION

Therefore, an object of the present invention is to provide a linear actuator which can generate large thrust with an axial dimension or height thereof being limited to a small value, and an apparatus utilizing the linear actuator.

The present invention provides a linear actuator comprising a cylindrical inner yoke made of a magnetic material and having an outer peripheral surface; a first cylindrical inner permanent magnet joined to the outer peripheral surface of the inner yoke and including an inner peripheral portion which is magnetized so as to have one of north and south poles and an outer peripheral portion which is magnetized so as to have the other pole, the first inner permanent magnet having an outer diameter and an outer peripheral surface; a second cylindrical inner permanent magnet joined to the outer peripheral surface of the inner yoke so as to be spaced away from the first inner permanent magnet and including inner and outer peripheral portions which are magnetized so as to have polarities opposite to polarities of the inner and outer peripheral portions of the first inner permanent magnet respectively, the second inner permanent magnet having an outer diameter; an outer yoke made of a magnetic material and formed into such a cylindrical shape that the outer yoke has an inner diameter larger than the outer diameters of the first and second inner permanent magnets, the outer yoke being disposed on the outer peripheral portions of the first and second inner permanent magnets, the outer yoke having an inner peripheral surface; an interconnecting member interconnecting the outer and inner yokes so that the inner peripheral surface of the outer yoke is radially opposed to the outer peripheral surfaces of the first and second inner permanent magnets; a first outer permanent magnet joined to the inner peripheral surface of the outer yoke with a first gap being defined between the first inner and outer permanent magnets and formed into such a cylindrical shape that the first outer permanent magnet is radially opposed to the outer peripheral surface of the first inner permanent magnet, the first outer permanent magnet including inner and outer peripheral portions both of which are magnetized so as to have the same polarity as the inner and outer peripheral portions of the first inner permanent magnet respectively; a second outer permanent magnet joined to the inner peripheral surface of the outer yoke so as to be axially spaced away from the first outer permanent magnet, the second outer permanent magnet being formed into such a cylindrical shape as to be radially opposed to the outer peripheral surface of the second inner permanent magnet with a second gap therebetween; a first armature coil made by winding a magnet wire into a cylindrical shape and inserted into the first gap so as to be axially movable; and a second armature coil made by winding a magnet wire into a cylindrical shape and inserted into the second gap so as to be axially movable, the second armature coil being mechanically connected to the first armature coil. In the linear actuator, the inner yoke includes an inner thicker portion axially opposed to the first and second inner permanent magnets and having a larger radial thickness than a remaining portion of the inner yoke, and the outer yoke includes an outer thicker portion axially opposed to the first and second outer permanent magnets and having a larger radial thickness than a remaining portion of the outer yoke.

According to the above-described construction, the first armature coil is disposed between the first inner and outer permanent magnets so as to be axially movable. The second armature coil is disposed between the second inner and outer permanent magnets so as to be axially movable. Consequently, the axial dimension or height of the linear actuator can be suppressed to a smaller value. Moreover, since an amount of magnetic flux interlinking each of the first and second armature coils is increased, the thrust generated by each armature coil can be rendered larger. With this, the first and second inner permanent magnets are disposed so as to be axially spaced away from each other, and the first and second outer permanent magnets are disposed so as to be axially spaced away from each other. Accordingly, magnetic flux is prevented from directly looping between the first and second inner permanent magnets and between the first and second outer permanent magnets. Consequently, since an amount of magnetic flux interlinking each of the first and second armature coils is further increased, the thrust generated by each armature coil can be rendered further larger.

BRIEF DESCRIPTION OF THE DRAWINGS

Other objects, features and advantages of the present invention will become clear upon reviewing the following description of the embodiment with reference to the accompanying drawings, in which.

DETAILED DESCRIPTION OF THE INVENTION

Figure 1:
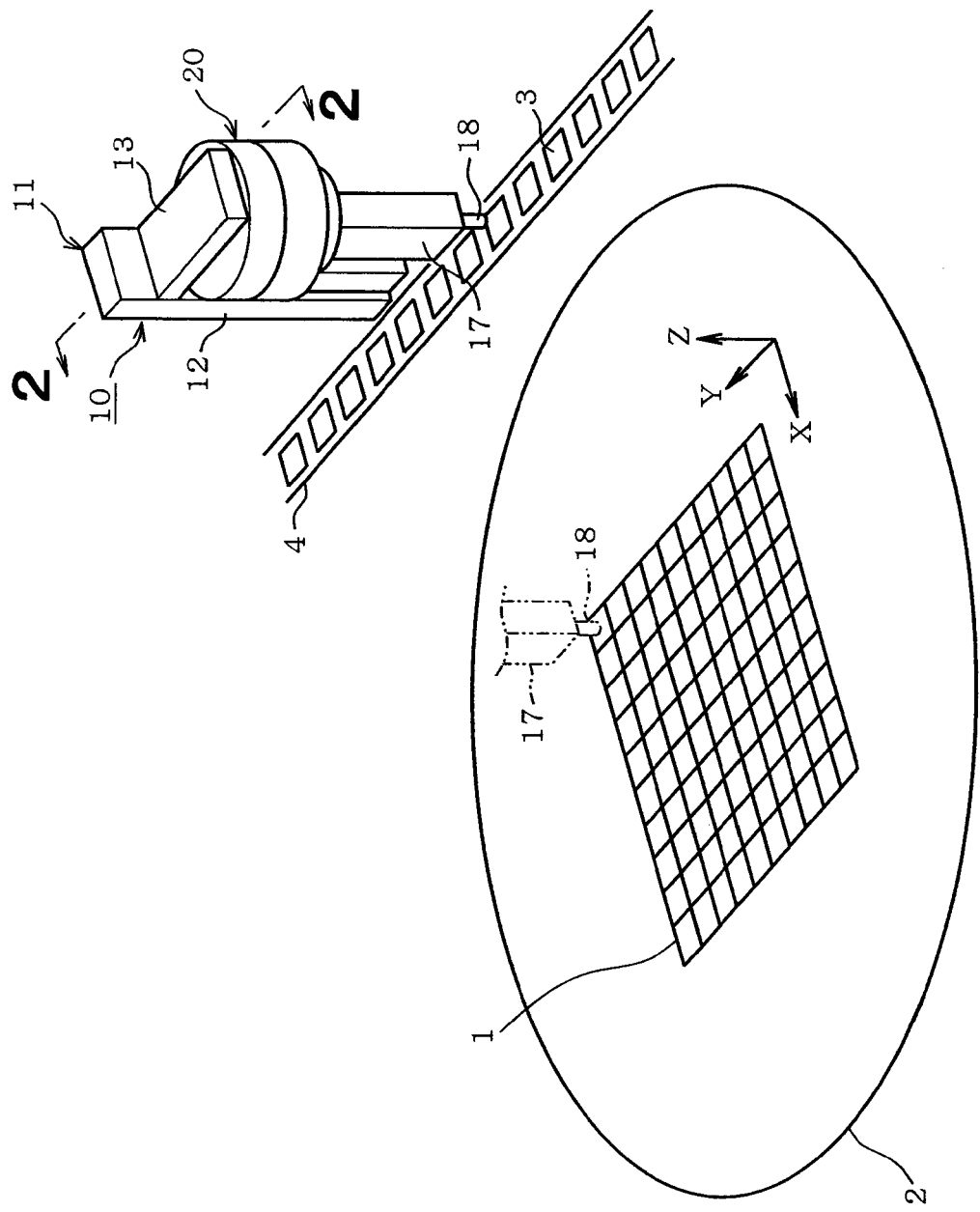
FIG. 1 is a perspective view showing an appearance of a die bonder utilizing a linear actuator in accordance with one embodiment of the present invention.

A first embodiment of the present invention will be described with reference to FIGS. 1 to 7. In forming a semiconductor chip 1, an image of a circuit pattern is printed on a semiconductor wafer 2 and light exposure, etching and other processes are applied to the circuit pattern as shown in FIG. 1. Thereafter, the circuit pattern is cut from the wafer 2 into a rectangular shape, whereby a semiconductor chip 1 is formed. A plurality of semiconductor chips 1 are arranged in a plurality of rows and columns. A plurality of lead frames 3 are aligned on the right of the semiconductor chips 1. The lead frames 3 are formed with bonding layers comprised of a bonding agent respectively. Each semiconductor chip 1 is thrust into the bonding layer thereby to be mounted on the lead frame 3. The lead frames 3 are carried on a conveyor 4. The conveyor 4 conveys the lead frames 3 to a wire bonder at a subsequent step, where electrodes of the semiconductor chips 1 are connected to leads of the lead frames 3 by the wire bonder.

A die bonder 10 takes out the semiconductor chips 1 from the wafer 2. The construction of the die bonder 10 will now be described. A transfer head 11 is coupled to an arm of an XY orthogonal coordinate robot and includes a vertically long plate-shaped base 12 and a horizontally long plate-shaped holder 13. The arm of the XY orthogonal coordinate robot includes an X-axis servomotor serving as a drive source and driven to move the transfer head 11 linearly in the X direction. The arm further includes a Y-axis servomotor serving as a drive source and driven to move the transfer head 11 linearly in the Y direction. In this case, the Y direction refers to a horizontal direction parallel to the direction in which the lead frames 3 are aligned, whereas the X direction refers to a horizontal direction perpendicular to the Y direction. A linear slider 14 is attached to the base 12 of the transfer head 11. The linear slider 14 includes a guide 15 immovably fixed to the base 12, a slide 16 attached to the guide 15 so as to be movable linearly in the Z direction, and a Z-axis servomotor (not shown) driven to move the slide 16 in the Z direction. The Z direction in this case refers to a vertical direction perpendicular to both X and Y directions. The linear slider 14 serves as an operating mechanism, and the XY orthogonal coordinate robot serves as a transfer mechanism.

Figure 2:
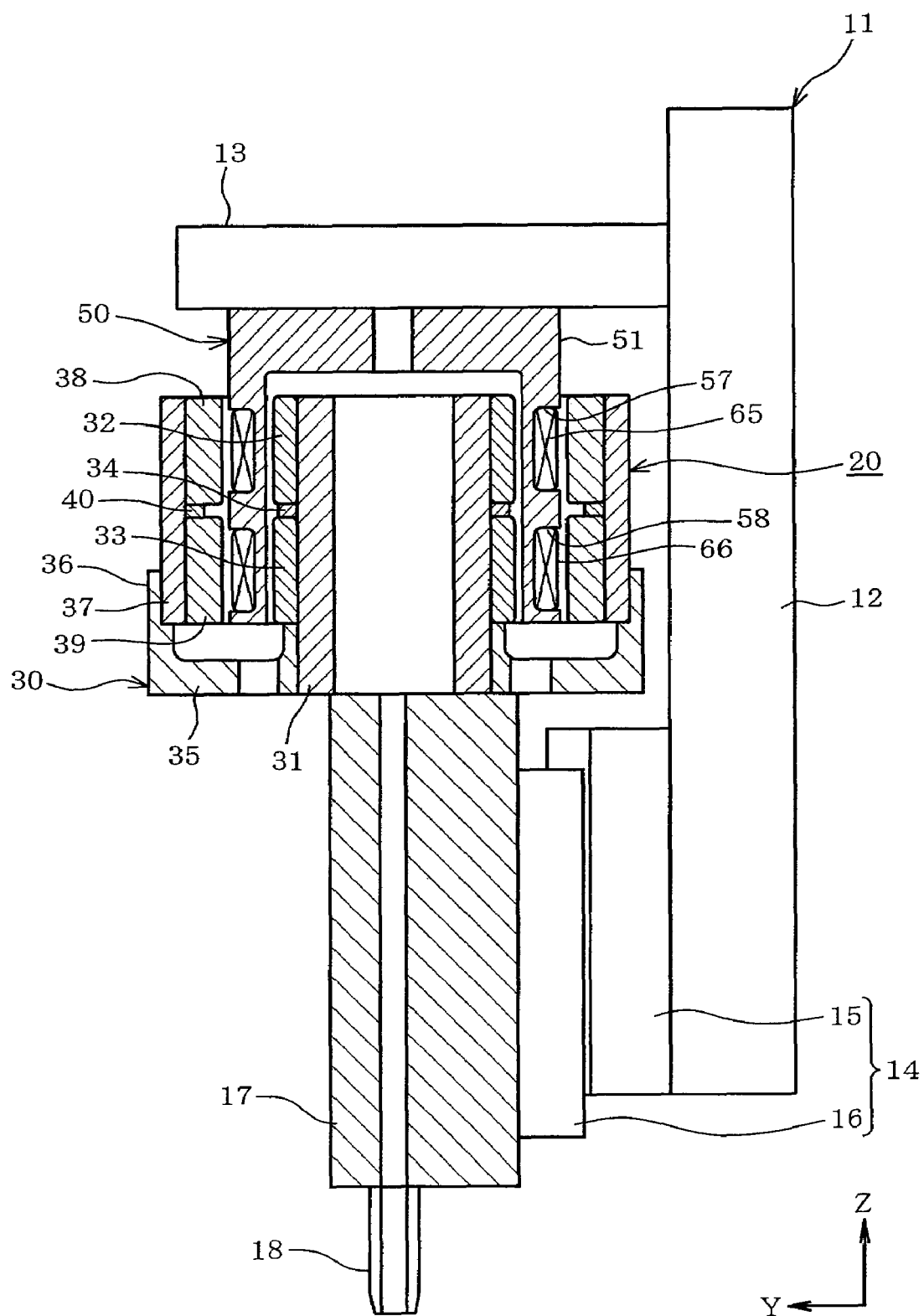
FIG. 2 is a sectional view taken along line 2-2 in FIG. 1.

A nozzle head 17 is immovably fixed to the slide 16 of the linear slider 14 as shown in FIG. 2. An adsorption nozzle 18 is secured to the nozzle head 17. The XY orthogonal coordinate robot moves the transfer head 11 in the X and Y directions thereby to move the adsorption nozzle 18 between a pre-adsorption position and a pre-mounting position. The pre-adsorption position refers to a position where the adsorption nozzle 18 is opposed, directly from above, to the semiconductor chip 1 to be adsorbed and serves as a first thrust position. The pre-mounting position refers to a position where the adsorption nozzle 18 is opposed, directly from above, to the lead frame 3 to which the semiconductor chip 1 is to be mounted and serves as a second thrust position. The adsorption nozzle 18 is connected to an inlet of a vacuum pump (not shown). The vacuum pump is driven to evacuate the adsorption nozzle 18, which then adsorbs the semiconductor chip 1. When the adsorption nozzle 18 has been moved to the pre-adsorption position, the linear slider 14 moves the nozzle head 17 downward so that the adsorption nozzle 18 is thrust into the semiconductor chip 1 thereby to adsorb the semiconductor chip 1. When the adsorption nozzle 18 has been moved to the pre-mounting position, the linear slider 14 moves the nozzle head 17 downward so that the semiconductor chip 1 held by the adsorption nozzle 18 is thrust into the bonding layer of the target lead frame 3, whereby the semiconductor chip 1 is mounted on the lead frame 3.

Figure 3:
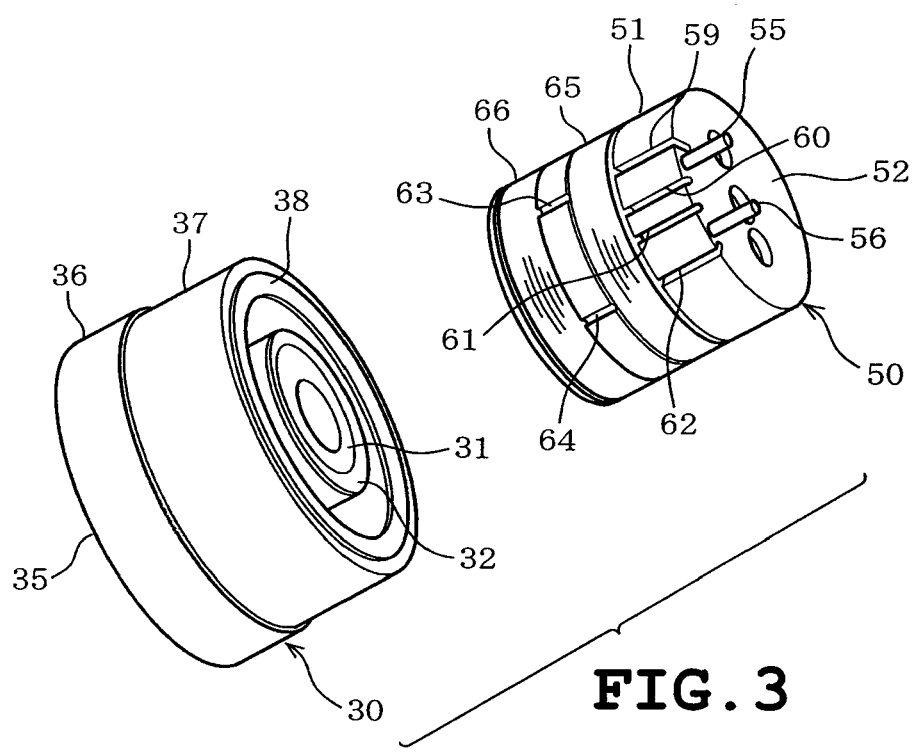
FIG. 3 is an exploded perspective view of magnet and winding.

A cylindrical linear actuator 20 is coupled to the nozzle head 17 as shown in FIG. 2. The linear actuator 20 applies a downward thrust to each of the adsorption nozzle 18 and the slide 16. There is a possibility that the slide 16 would be moved relative to the guide 15 by vibration due to movement of the transfer head 11. However, the thrust applied to the slide 16 prevents the slide from the relative movement. The thrust applied to the adsorption nozzle 18 adjusts pressure applied to the semiconductor chip 1 by the adsorption nozzle 18 in the case where the adsorption nozzle adsorbs the semiconductor chip 1 from the semiconductor wafer 2. The linear actuator 20 includes a magnet section 30 and a winding section 50 as shown in FIG. 3. The magnet section 30 is fixed to the nozzle head 17 which constitutes the moving side, whereas the winding section 50 is fixed to the transfer head 11 which constitutes the stationary side.

The magnet and winding sections 30 and 50 will now be described in detail.

Figure 4:
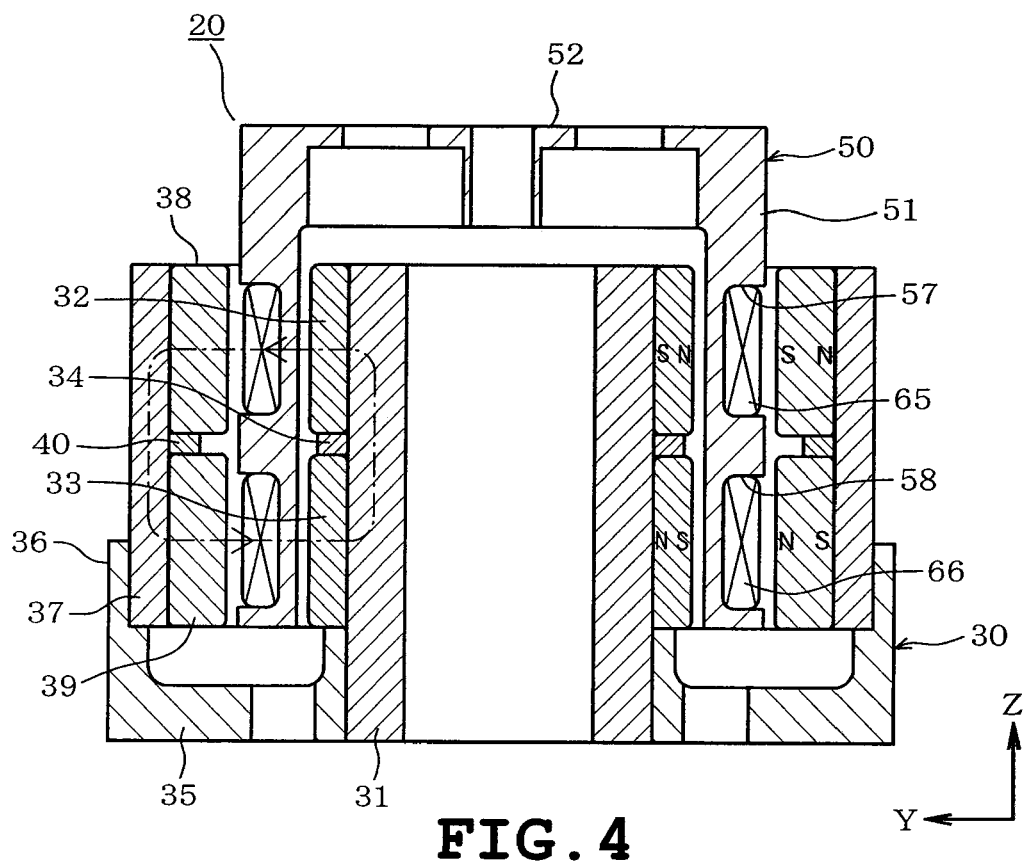
FIG. 4 is a sectional view of the linear actuator.
Figure 5:
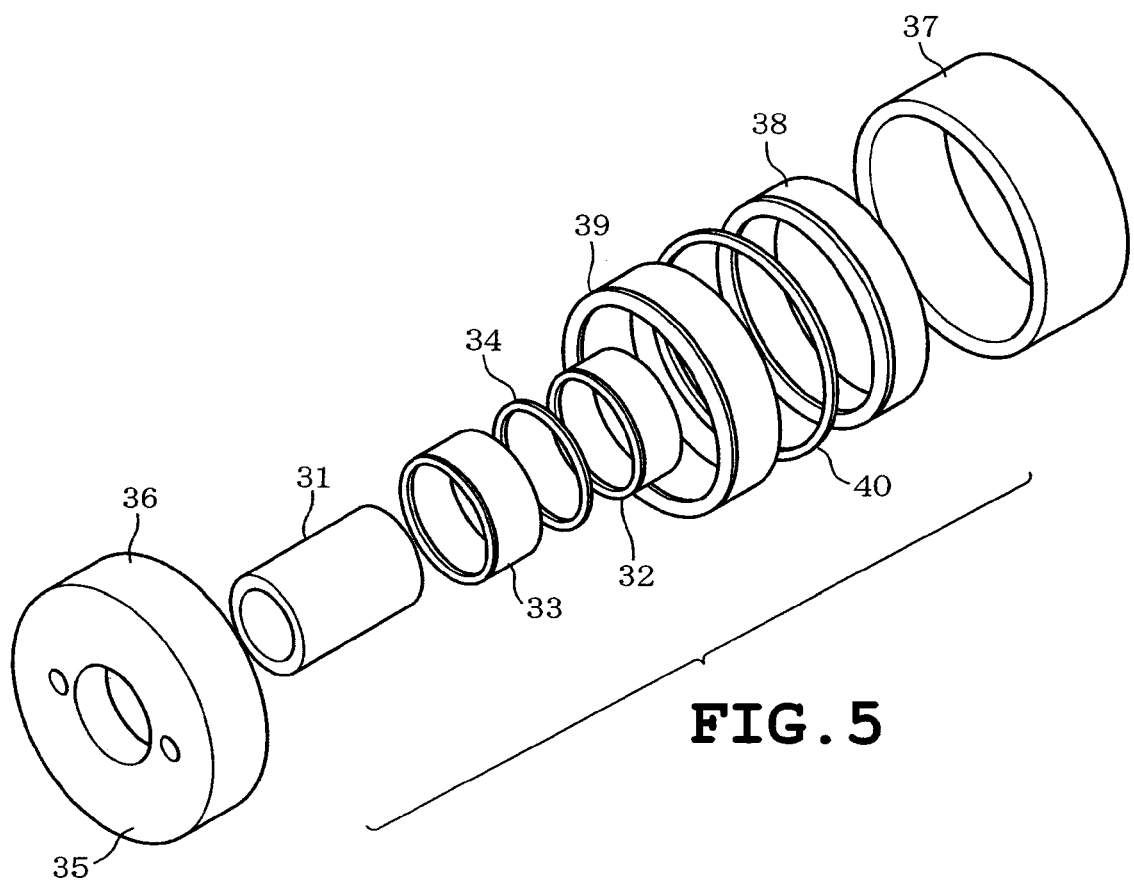
FIG. 5 is an exploded perspective view of a magnet section.

1. Magnet Section 30:

A vertically long cylindrical inner yoke 31 is fixed to the nozzle head 17. The inner yoke 31 is formed by rounding a cold rolled steel plate made from permendur (Fe—Co). The inner yoke 31 has a radial dimension or width that is constant entirely axially. The inner yoke 31 also has inner and outer diameters both of which are constant entirely axially. An inner upper permanent magnet 32 is fitted with the inner yoke 31 so that an inner peripheral surface of the magnet is in contact with an outer peripheral surface of the inner yoke 31 as shown in FIG. 4. The inner upper permanent magnet 32 serves as a first inner permanent magnet and is immovably joined to the inner yoke 31 by a bonding agent. The inner upper permanent magnet 32 is cylindrical and concentric with the inner yoke 31. The inner upper permanent magnet 32 is magnetized so that an outer peripheral portion thereof assumes the north pole and so that an inner peripheral portion thereof assumes the south pole.

An inner lower permanent magnet 33 is fitted with the inner yoke 31 so that an inner peripheral surface of the magnet is in contact with an outer peripheral surface of the inner yoke 33 as shown in FIG. 4. The inner lower permanent magnet 33 is immovably joined to the inner yoke 31 by an adhesive agent. The inner lower permanent magnet 33 serves as a second inner permanent magnet 33 is disposed below the inner upper permanent magnet 32 so as to be spaced away from magnet 32. The inner lower permanent magnet 33 is cylindrical and concentric with the inner yoke 31. The inner lower permanent magnet 33 is cylindrical and concentric with the inner yoke 31. The inner lower permanent magnet 33 is magnetized so that an outer peripheral portion thereof assumes the south pole and so that an inner peripheral portion thereof assumes the north pole. An inner spacer 34 made of an insulating synthetic resin is interposed between the inner upper and lower permanent magnets 32 and 33. The inner spacer 34 is annular in shape and concentric with each of the inner upper and lower permanent magnets 32 and 33. The inner spacer 34 has an axial dimension or width set so as to be equal to one half of a radial dimension or width of each of the inner upper and lower permanent magnets 32 and 33. More specifically, the inner lower permanent magnet 33 is disposed so as to be axially spaced away from the inner upper permanent magnet by a distance equal to one half of the radial dimension or width of each of inner and outer permanent magnets 32 and 33.

A coupling plate 35 has an inner peripheral surface fitted with the outer peripheral surface of the inner yoke 31 as shown in FIG. 4. The coupling plate 35 is cylindrical and is immovably joined to the inner yoke 31 by a bonding agent so as to be concentric with the yoke. The coupling plate 35 is made from a non-magnetic material such as aluminum and includes an outer peripheral portion formed with an upwardly protruding cylindrical holder 36. The coupling plate 35 serves as a coupling member, and the holder 36 has an inner peripheral surface to which an outer yoke 37 is joined by a bonding agent. The outer yoke 37 is formed into such a cylindrical shape as to have a larger inner diameter than outer diameters of the inner upper ad lower permanent magnets 32 and 33. The outer yoke 37 has an outer peripheral surface brought into contact with the inner peripheral surface of the holder 36 so as to be retained at a predetermined position where the outer yoke 37 is concentric with the inner yoke 31. The outer yoke 37 is formed by rounding a cold rolled steel plate made from permendur (Fe—Co). The outer yoke 37 has a radial dimension or width that is constant entirely axially. The outer yoke 37 also has inner and outer diameters both of which are constant in an entirely axial dimension. The outer yoke 37 has an inner peripheral surface radially opposed to the outer peripheral surfaces of the inner upper and lower permanent magnets 32 and 33 with a gap therebetween.

An outer upper permanent magnet 38 is fitted with the outer yoke 37 so that an outer peripheral surface of the magnet is in contact with an inner peripheral surface of the outer yoke 37 as shown in FIG. 4. The outer upper permanent magnet 38 is immovably joined to the outer yoke 37 by a bonding agent. The outer upper permanent magnet 38 serves as a first outer permanent magnet. The outer upper permanent magnet 38 is formed into such a cylindrical shape as to be concentric with the inner and outer yokes 31 and 37. The outer upper permanent magnet 38 has an axial dimension or height so set as to be equal to the height of the inner upper permanent magnet 32. The outer upper permanent magnet 38 is magnetized in the same manner as the inner upper permanent magnet 32 so that an outer peripheral portion thereof assumes the north pole and so that an inner peripheral portion thereof assumes the south pole.

An outer lower permanent magnet 39 is fitted with the outer yoke 37 so that an outer peripheral surface of the magnet is in contact with an inner peripheral surface of the outer yoke 37 as shown in FIG. 4. The outer lower permanent magnet 39 is immovably joined to the outer yoke 37 by a bonding agent. The outer lower permanent magnet 39 is formed into such a cylindrical shape as to be concentric with the inner and outer yokes 31 and 37. The outer lower permanent magnet 39 is located below the outer upper permanent magnet 38 so as to be spaced away from the magnet 38. The outer lower permanent magnet 39 has the same axial dimension or height as the inner lower permanent magnet 33 and is disposed at the same height as the inner lower permanent magnet 33. The outer lower permanent magnet 39 is magnetized in the same manner as the inner lower permanent magnet 33 so that an outer peripheral portion thereof assumes the south pole and so that an inner peripheral portion thereof assumes the north pole. The outer lower permanent magnet 39 serves as a second permanent magnet.

An outer spacer 40 is interposed between the outer upper and lower permanent magnets 38 and 39 as shown in FIG. 4. The inner spacer 40 is made of the same type of insulating material as the inner spacer 34 and is annular in shape and concentric with the outer yoke 37. The outer spacer 40 has an axial dimension or width set so as to be equal to one half of a radial dimension or width of each of the outer upper and lower permanent magnets 38 and 39. More specifically, the outer lower permanent magnet 39 is disposed so as to be axially spaced away from the outer upper permanent magnet 38 by a distance equal to one half of the radial dimension or width of each of inner and outer permanent magnets 38 and 39.

2. Winding Section 50:

A cylindrical bobbin 51 is immovably fixed to the holder 13 of the transfer head 11 as shown in FIG. 2. The bobbin 51 is made from a synthetic resin such as polyphenylene sulfide (PPS) resin and is disposed so as to be concentric with the inner and outer yokes 31 and 37 as shown in FIG. 4. The bobbin 51 has an outer diameter set so as to be smaller than the inner diameters of the outer and inner upper permanent magnets 38 and 39. The bobbin 51 further has an inner diameter set so as to be smaller than the outer diameters of the outer and inner upper permanent magnets 38 and 39. The inner peripheral surfaces of the permanent magnets 38 and 39 are spaced away from the outer peripheral surface of the bobbin 51. The outer peripheral surfaces of the inner upper and lower permanent magnets 32 and 33 are spaced away from the inner peripheral surface of the bobbin 51. That is, the bobbin 51 is axially movable relative to the magnet section 30.

Figure 6:
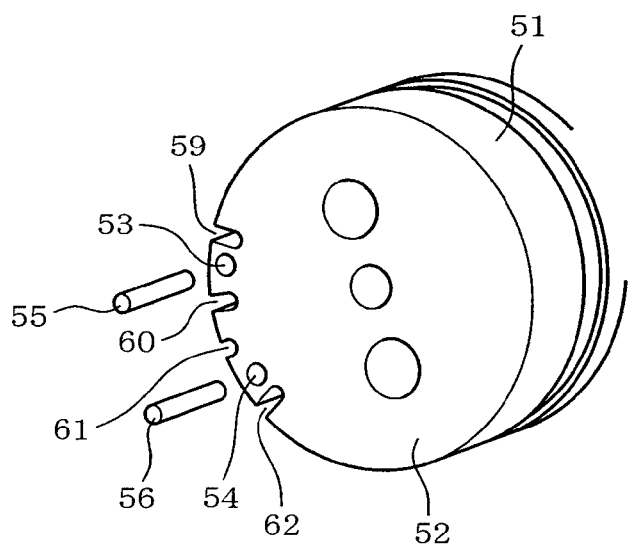
FIG. 6 is a perspective view of a winding section.
Figure 7:
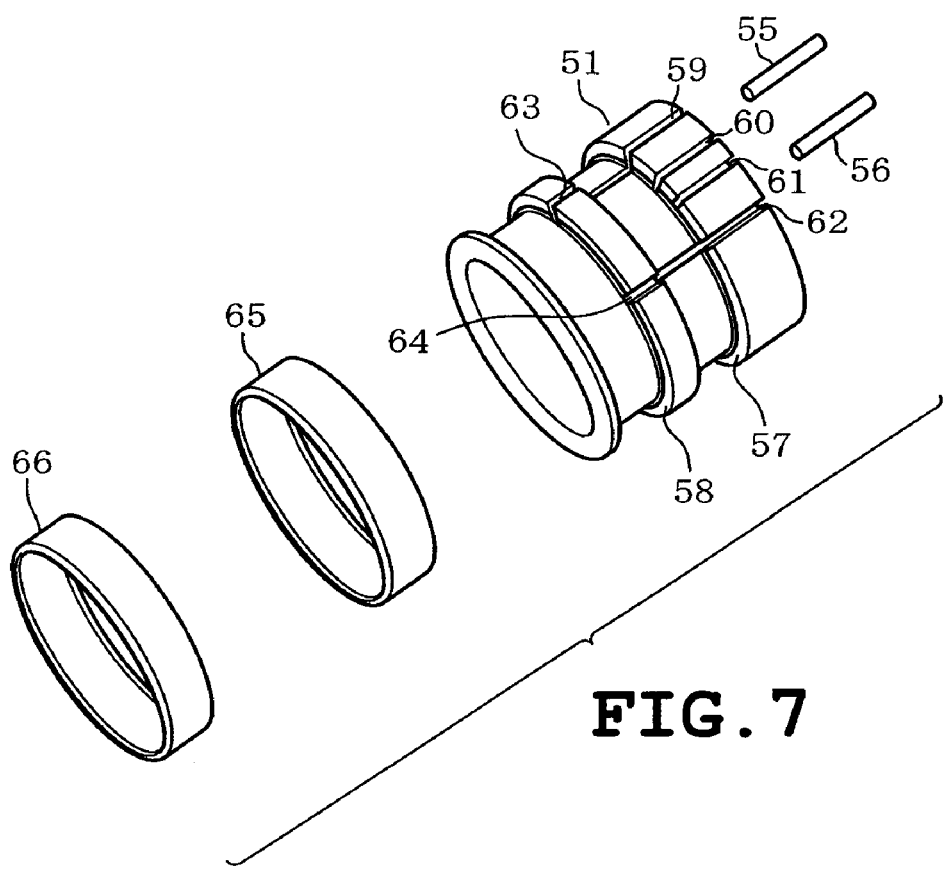
FIG. 7 is an exploded perspective view of the winding section.

The bobbin 51 is formed with a circular end plate 52 closing an upper opening thereof. The end plate 52 has an outer peripheral portion formed with two pin holes 53 and 54 as shown in FIG. 6. A power supply terminal 55 has an end which is fixed in the pin hole 53 by a boding agent so as to be prevented from falling off. A power supply terminal 56 also has an end which is fixed in the pin hole 54 by a bonding agent so as to be prevented from falling off. Each of the power supply terminals 55 and 56 is made of an electrically conductive material such as copper or the like and formed into the shape of a pin. A part of the power supply terminal 55 other than one end thereof protrudes from the end plate 52. A part of the power supply terminal 56 other than one end thereof also protrudes from the end plate 52.

The bobbin 51 includes an upper coil winding portion 57 located between the inner and outer upper permanent magnets 32 and 38 as shown in FIG. 4. The bobbin 51 further includes a lower coil winding portion 58 located between the inner and outer lower permanent magnets 33 and 39. Each of the upper and lower coil winding portions 57 and 58 has an outer peripheral surface which is open and is formed into the shape of a concavity. The concavity is formed in an entire circumference of the bobbin 51 so as to encompass the bobbin 51. The bobbin 51 is formed with four upper grooves 59 to 62 located above the upper coil winding portion 57. Lower grooves 63 and 64 are formed so as to be located between the upper and lower coil winding portions 57 and 58. A magnet wire is inserted into each of grooves. Each of the grooves 59-62 and 63 and 64 is axially formed into a straight shape and extends linearly.

An upper armature coil 65 is disposed in the upper coil winding section 57 which is located between the inner and outer upper permanent magnets 32 and 38 so as to be axially movable, as shown in FIG. 4. The upper armature coil 65 comprises a magnet wire wound on the coil winding section 57 clockwise. The armature coil 65 has a winding start end soldered through the lower crossover groove 63 to the power supply terminal 55. The armature coil 65 also has a winding termination end inserted through the upper crossover groove 63 into the lower coil winding section 58. The upper armature coil 65 serves as a first armature coil.

A lower armature coil 66 is disposed in the lower coil winding section 58 which is located between the inner and outer lower permanent magnets 33 and 39 so as to be axially movable. The lower armature coil 66 is formed by winding the winding termination end of the coil 65 on the lower coil winding section 58. The lower armature coil 66 is wound counterclockwise, that is, in the direction opposed to the direction in which the upper armature coil 65 is wound. The armature coil 66 has a winding termination end passed through the lower and upper crossover grooves 64 and 62 in turn and then soldered to the power supply terminal 56. The lower armature coil 66 serves as a second armature coil. Magnetic flux generated by the inner upper permanent magnet 32 passes through the upper armature coil 65, the outer upper permanent magnet 38, the outer yoke 37, the outer lower permanent magnet 39, the lower armature coil 65, the inner lower permanent magnet and the inner yoke 31 sequentially in this order to be returned to the inner upper permanent magnet 32, whereupon the magnetic flux intersects each of the upper and lower armature coils 65 and 66 perpendicularly to the winding direction of the magnet wire.

The upper and lower armature coils 65 and 66 are connected in series to each other. Accordingly, when voltage is applied between the power supply terminals 55 and 56, electric currents flow through the armature coils 65 and 66 in opposite directions respectively. Common downward thrust is produced in each of the upper and lower armature coils 65 and 66 thereby to be applied from the winding portion 50 or the fixed side to the magnet portion 30 or the movable side. The upper and lower armature coils 65 and 66 are energized at both adsorbing and mounting steps. In the adsorption step, the adsorption nozzle 18 is moved downward so as to be thrust into the semiconductor chip 1, thereby adsorbing the semiconductor chip 1. In the mounting step, the adsorption nozzle 18 is moved downward so that the semiconductor chip 1 adsorbed by the nozzle 18 is thrust into the bonding layer of the lead frame 3, whereby the semiconductor chip 1 is mounted on the lead frame 3. Downward thrust is applied to the adsorption nozzle 18 in each of the adsorption and mounting steps.

Figure 13:
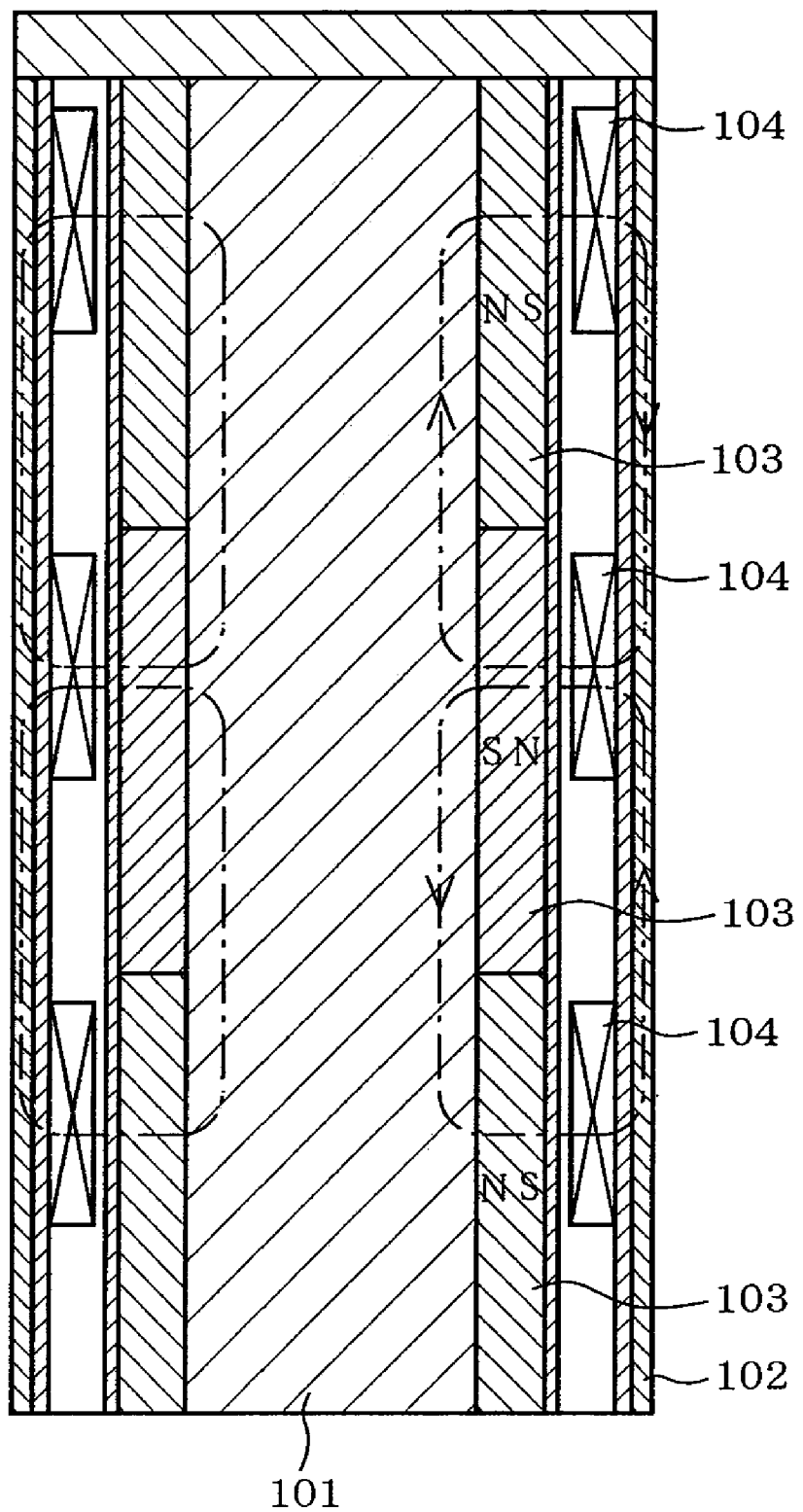
FIG. 13 shows a conventional linear actuator.

The following effects are achieved from the first embodiment. The upper armature coil 65 is disposed between the inner and outer upper permanent magnets 32 and 38 so as to be axially movable. The lower armature coil 66 is disposed between the inner and outer lower permanent magnets 33 and 39 so as to be axially movable. Consequently, the axial dimension or height can be restrained as compared with the conventional linear actuator as shown in FIG. 13. Moreover, since an amount of magnetic flux interlinking the upper and lower armature coils 65 and 66 is increased as compared with the conventional linear actuator of FIG. 13, the thrust produced by each armature coil can be rendered larger. Furthermore, the flow of magnetic flux is established through the inner upper permanent magnet 32, inner lower permanent magnet 33, outer upper permanent magnet 38 and outer lower permanent magnet 39 without through the coupling plate 35. Accordingly, since the coupling plate 35 made from non-magnetic aluminum is allowed to be used, the weight of the linear actuator 20 can be reduced.

Since the inner upper and lower permanent magnets 32 and 33 are disposed so as to be axially spaced away from each other, magnetic flux can be restrained from returning from the inner upper permanent magnet 32 directly to the inner lower permanent magnet 33. Moreover, since the outer upper and lower permanent magnets 38 and 39 are also disposed so as to be axially spaced away from each other, magnetic flux can be restrained from returning from the outer upper permanent magnet 38 directly to the outer lower permanent magnet 39. Accordingly, since magnetic flux interlinking the upper armature coil 65 and magnetic flux interlinking the lower armature coil 66 are increased, thrust force can also be increased. This effect can be improved when the distance between the inner upper and lower permanent magnets 32 and 33 is set so as to be one half of the axial dimension or width of the inner upper permanent magnet 32 and the axial dimension or width of the inner lower permanent magnet 33.

The inner and outer yokes 31 and 37 are each made of the cold rolled material such as permendule which has a larger saturated magnetic flux density than iron. Accordingly, since the inner and outer yokes 31 and 37 is rendered thinner than when the yokes are made of iron, the weight of the linear actuator 20 can further be reduced. Moreover, since the yokes 31 and 37 are formed by rounding the cold rolled material such as permendule, an amount of wasted material can be rendered smaller than when the cold rolled material is cut. Consequently, since an amount of permendule used is reduced, the above-described construction of the yokes is advantageous in the saving energy and low costs.

The lightweight linear actuator 20 is provided between the transfer head 11 of the die bonder 10 and the adsorption nozzle 18 so that the upper and lower armature coils 65 and 66 are movable in the Z direction. Consequently, since the total weight of the transfer head 11, linear slider 14, nozzle head 16, linear actuator 20 is rendered smaller, the load of each of the X-axis, Y-axis and Z-axis servomotors can be rendered smaller. Accordingly, since small-sized low output motors can be used as the X-axis, Y-axis and Z-axis motors, the total size of the die bonder 10 can be reduced. Moreover, the adsorption nozzle 18 can be operated quickly in the X, Y and Z directions. As a result, since the tact time of the die bonder 10 is rendered shorter, the productivity can be improved.

Figure 8:
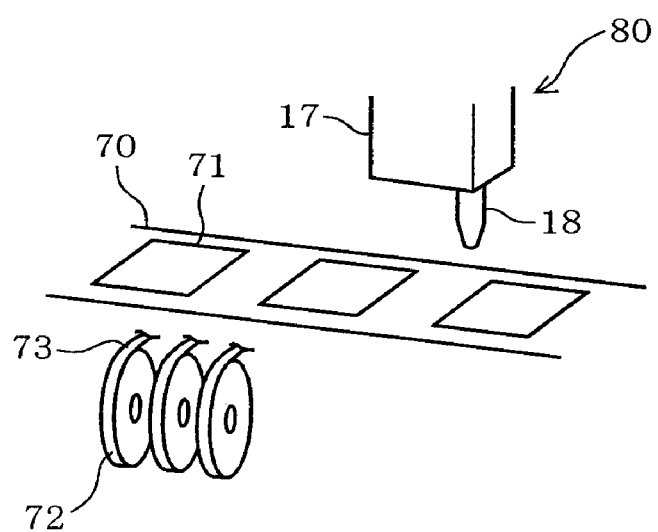
FIG. 8 is a perspective view of a chip mounter utilizing the linear actuator in accordance with a second embodiment of the invention.

FIG. 8 illustrates a second embodiment of the invention. A plurality of printed circuit boards 71 are loaded on a belt conveyor 70. Each printed circuit board 71 is formed with a solder layer comprised of cream solder. The belt conveyor 70 is driven so that the printed circuit boards 71 are conveyed along the conveyor. A plurality of reels 72 are placed in front of the belt conveyor 70. Tapes 73 are wound on the reels 72 respectively. Electronic components such as chip resistors, chip capacitors or the like are bonded to the tapes 73. The electronic components are thrust into the solder layers of the printed circuit boards 71 after having been taken out of the tapes 73, so that the electronic components are mounted on the printed circuit boards 71. The electronic components serve as components.

The chip mounter 80 takes out the electronic components from the tapes 73, thrusting the electronic components into the solder layers of the printed circuit boards 71. The chip mounter 80 serves as a component holder and includes the XY orthogonal coordinate robot and the transfer head 11 both serving as the transfer mechanism, the linear slider 14 and the nozzle head 17 both serving as the operating mechanism and the adsorption nozzle 18 and the linear actuator 20 both serving as the holding member. These are the same as those described in the first embodiment. The XY orthogonal coordinate robot moves the transfer head 11 in the X and Y directions so that the adsorption nozzle 18 is moved between the pre-adsorption position and the pre-mounting position. The adsorption nozzle 18 assuming the pre-adsorption position is opposed, directly from above, to the electronic component to be adsorbed. The adsorption nozzle 18 assuming the pre-mounting position is opposed, directly from above, to the printed circuit board 71 on which the semiconductor chip is to be mounted. The adsorption position serves as a thrust position.

The linear slider 14 moves the nozzle head 17 in the Z direction. When the nozzle head 17 is moved downward with the adsorption nozzle 18 assuming the pre-adsorption position, the adsorption nozzle 18 is thrust into the electronic component to be adsorbed, adsorbing the component. When the nozzle head 17 is moved downward with the adsorption nozzle 18 assuming the pre-mounting position, the electronic component adsorbed by the adsorption nozzle 18 is thrust into the printed circuit board 71 on which the electronic component is to be mounted, thereby being mounted on the printed circuit board. The linear actuator 20 applies downward thrust to the adsorption nozzle 18. The adsorption nozzle 18 applies pressure to the electronic component when the adsorption nozzle 18 adsorbs the electronic component from the tape 71. The adsorption nozzle 18 also applies pressure to the electronic component when the adsorption nozzle 18 mounts the electronic component on the printed circuit board 71. These pressures are adjusted by thrust force the linear actuator 20 applies to the adsorption nozzle 18.

The following effects are achieved from the second embodiment. The lightweight linear actuator 20 is provided between the transfer head 11 and the adsorption nozzle 18 so that the upper and lower actuators 65 and 66 are movable in the Z direction. Consequently, since the load of each of the X-axis, Y-axis and Z-axis servomotors are rendered smaller. Accordingly, since small-sized low output motors can be used as the X-axis, Y-axis and Z-axis motors, the total size of the chip mounter 80 can be reduced. Moreover, since the adsorption nozzle 18 is operated quickly in the X, Y and Z directions, the productivity can be improved.

In each of the first and second embodiments, the upper and lower armature coils 65 and 66 may be wound in the same direction and connected in parallel to each other so that the directions in which the current flows through the upper and lower armature coils 65 and 66 are opposed to each other. In this arrangement, when the upper and lower armature coils 65 and 66 are wound on the bobbin 51 in turn, no work is necessitated to change the winding direction during the winding. Consequently, the working time can be shortened. The upper and lower armature coils 65 and 66 are wound in the following procedures. The magnet wire is wound on the upper coil winding portion 57 of the bobbin 51 clockwise as viewed at one axial side, whereby the upper armature coil 65 is constituted. The magnet wire has a winding start end soldered through the upper crossover groove 61 to the power supply terminal 56. The magnet wire also has a winding termination end inserted through the upper and lower crossover grooves 62 and 64 in turn into the lower coil winding section 58 of the bobbin 51. The remaining of the magnet wire is wound on the lower coil winding section 58 in the same clockwise direction as the upper armature coil 65, whereby the lower armature coil 66 is constituted. The winding termination end of the magnet wire is passed through the lower and upper crossover grooves 63 and 60 in turn and soldered to the power supply terminal 55.

In each of the foregoing first and second embodiments, each of the inner and outer yokes 31 and 37 may have a non-uniform radial dimension or width. The following describes the inner and outer yokes 31 and 37 having respective non-uniform widths.

Figure 9:
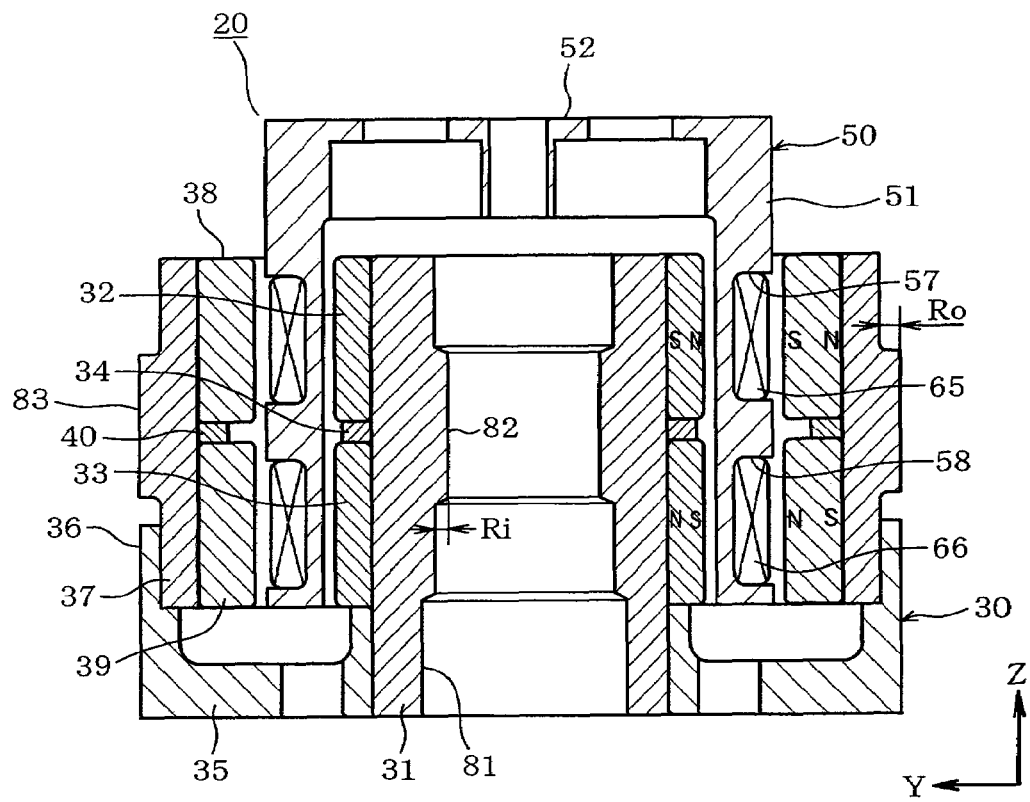
FIG. 9 is a view similar to FIG. 4, showing a third embodiment of the invention.
Figure 10:
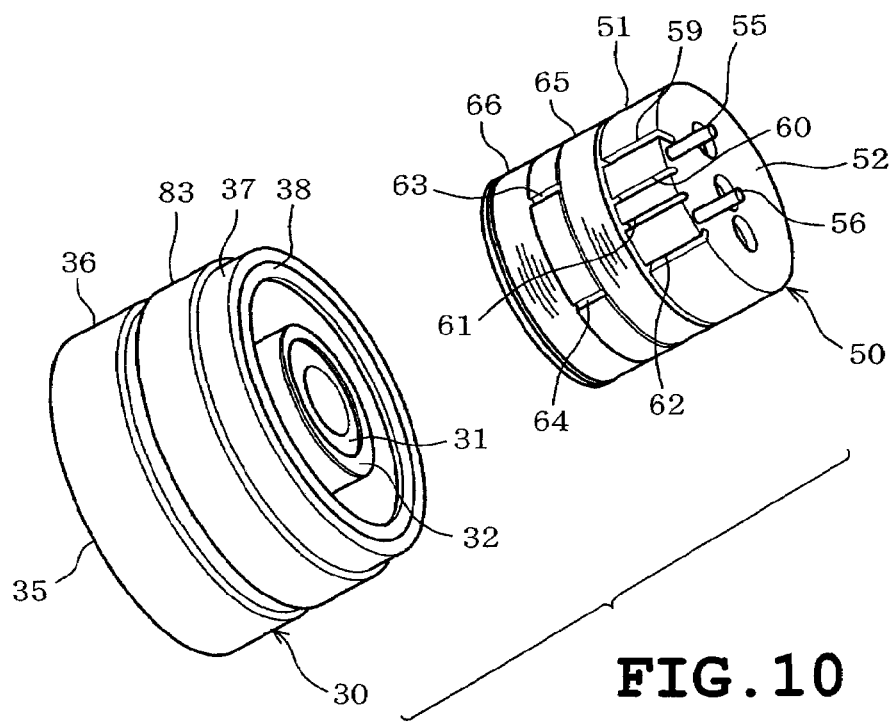
FIG. 10 is a view similar to FIG. 3.

FIGS. 9 and 10 illustrate a third embodiment of the invention. The inner yoke 31 includes an inner thinner portion 81 and an inner thicker portion 82 as shown in FIG. 9. The inner thinner portion 81 is set at an axial lower end of the inner yoke 31 and has a smaller radial width than the remaining portion of the inner yoke 31. The inner thinner portion 81 of the inner yoke 31 has a larger constant value than the remaining portion of the inner thinner portion 81. The inner thicker portion 82 is set at an axially central portion of the inner yoke 31. The inner upper and lower permanent magnets 32 and 33 and the inner spacer 34, are axially opposed to the inner thicker portion 82. The inner thicker portion 82 has a larger radial width than the remaining portion of the inner yoke 31. The inner thicker portion 82 of the inner yoke 31 has an inner diameter which is set at a smaller constant value than the remaining portion. Reference symbol Ri designates an amount of protrusion of the inner thicker portion 82. The protrusion amount Ri is set at 0.3 mm in the embodiments.

The outer yoke 37 is formed with an outer thicker portion 83 as shown in FIG. 10. The outer thicker portion 83 is set at an axially central portion of the outer yoke 37 as shown in FIG. 9. The outer upper and lower permanent magnets 38 and 39 and the outer spacer 40 are axially opposed to the outer thicker portion 83. The outer thicker portion 83 has a larger radial width than the remaining portion of the outer yoke 37. The outer thicker portion 83 of the outer yoke 37 has an inner diameter which is set at a larger constant value than the remaining portion. Reference symbol Ro designates an amount of protrusion of the inner thicker portion 82. The protrusion amount Ro is set at 0.5 mm in the embodiment.

The following effects are achieved from the third embodiment. The inner thicker portion 82 is formed on the inner yoke 31. The inner yoke 31 includes a boundary between the inner upper and lower permanent magnets 32 and 33. Magnetic flux concentrates on the boundary. The boundary has a larger radial dimension or width than the remaining portion. Consequently, the magnetic saturation can be prevented from occurring in the inner yoke 31 while an increase in the weight of the inner yoke 31 is restrained. Furthermore, the outer thicker portion 83 is formed on the outer yoke 37. The outer yoke 31 includes a boundary between the outer upper and lower permanent magnets 38 and 39. Magnetic flux concentrates on the boundary. The boundary has a larger radial dimension or width than the remaining portion. Consequently, the magnetic saturation can be prevented from occurring in the outer yoke 37 while an increase in the weight of the outer yoke 37 is restrained.

Figure 11:
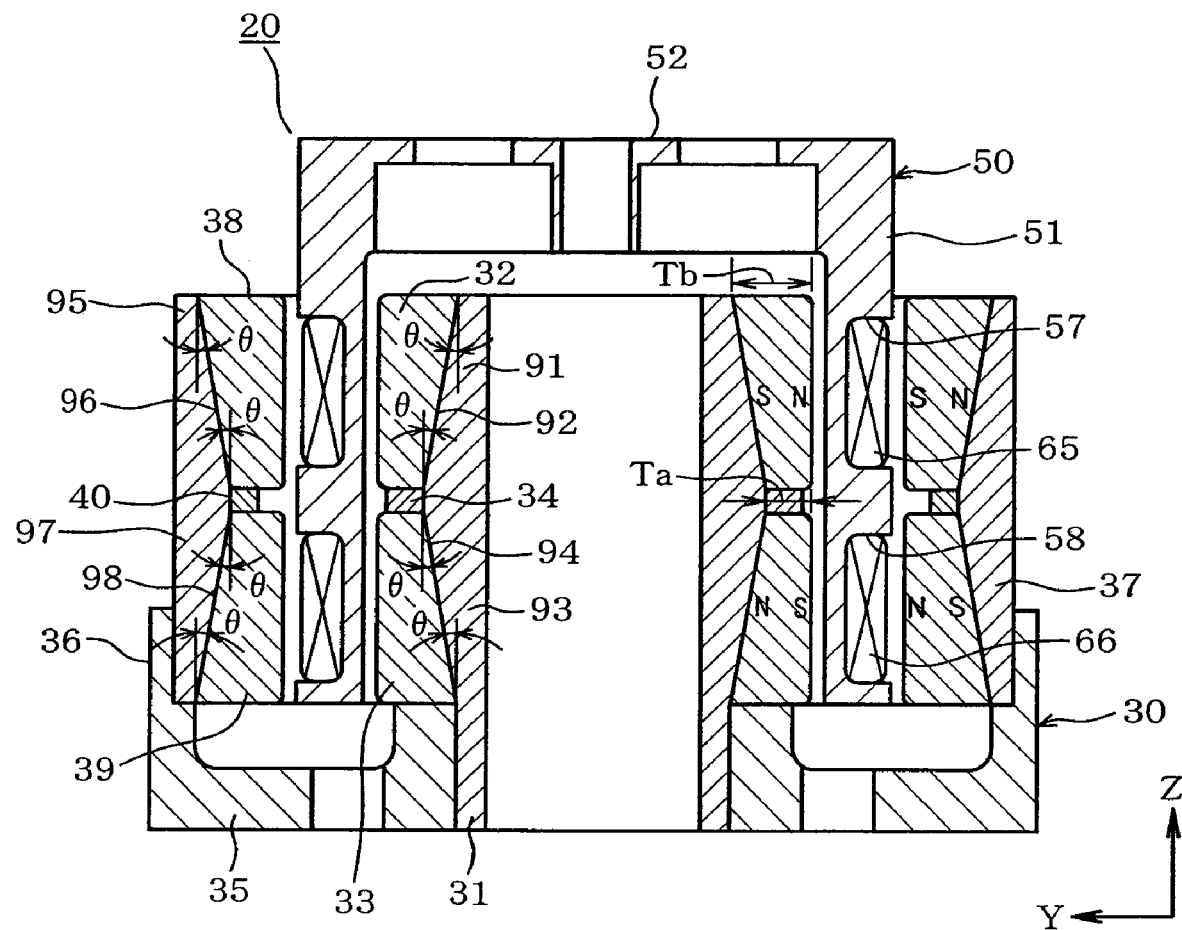
FIG. 11 is a view similar to FIG. 4, showing a fourth embodiment of the invention.
Figure 12:
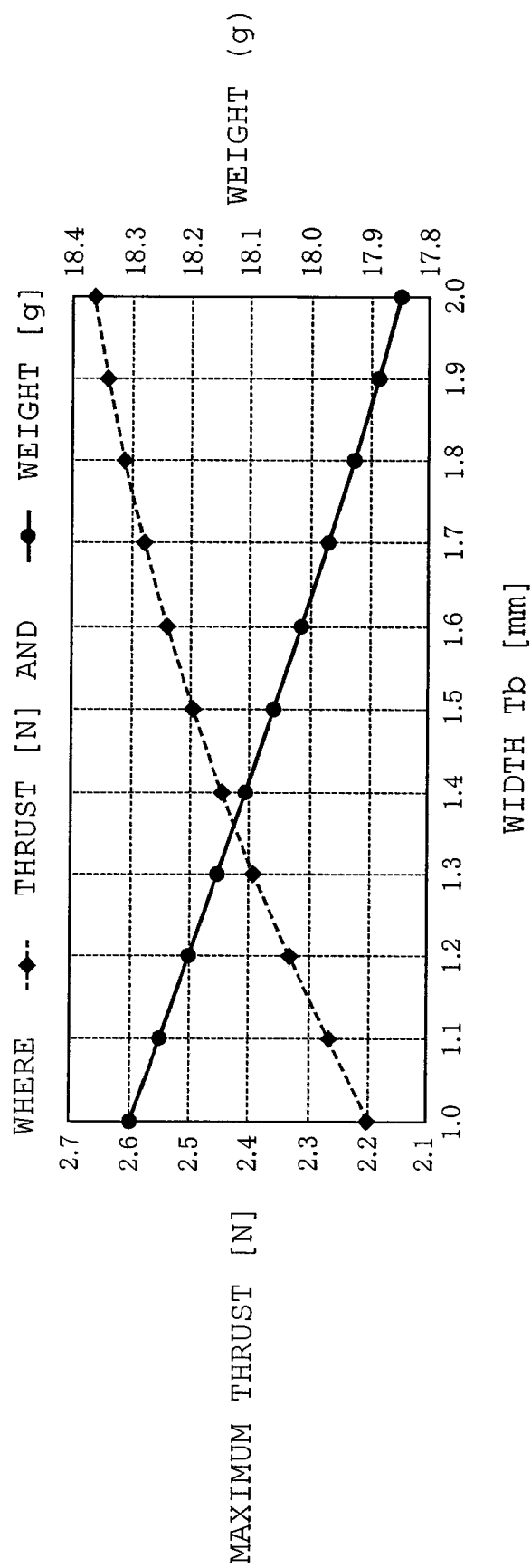
FIG. 12 is a graph showing changes in the maximum thrust and weight in the case where inclinations of inner upper and lower inclined surfaces are commonly changed.

FIGS. 11 and 12 illustrate a fourth embodiment of the invention. The inner yoke 31 is formed with an inner upper inclined portion 91 serving as a first inner inclined portion as shown in FIG. 11. The inner upper inclined portion 91 is a portion where the radial width is increased from an upper part to a lower part thereof. The inner upper inclined portion 91 has an outer diameter set so as to be increased from an upper part to a lower part and so as to be maximum at a contact surface between the inner upper permanent magnet 32 and the inner spacer 34. The inner upper inclined portion 91 has an outer peripheral surface to which an inner upper inclined portion 92 of the inner upper permanent magnet 32 is bonded in a face-to-face contact. The inner upper inclined surface 92 is inclined toward the outer peripheral side from an upper part toward a lower part. The radial width of the inner upper permanent magnet 32 is set so as to become smaller from an upper part toward a lower part. The inner upper inclined surface 92 serves as a first inner inclined surface.

The inner yoke 31 is formed with an inner lower inclined portion 93 serving as a second inclined portion as shown in FIG. 11. The inner inclined portion 93 has a radial width increased from a lower part toward an upper part thereof. The inner inclined portion 93 has an outer diameter set so as to be increased from the lower part toward the upper part and so as to be maximum at a contact surface between the inner lower inclined portion 93 and the inner spacer 34. An inner lower inclined surface 94 of the inner lower permanent magnet 33 is bonded to the outer peripheral surface of the inner lower inclined portion 93 in a face-to-face contact. The inner lower inclined surface 94 is inclined toward the outer peripheral side from an upper part toward a lower part thereof. The radial width of the inner lower permanent magnet 33 is set so as to become smaller from a lower part toward an upper part thereof. The inner upper inclined surface 94 serves as a second inner inclined surface. The inner lower inclined surfaces 94, inner lower inclined portion 93, inner upper inclined surface 92 and inner upper inclined portion the outer lower permanent magnet 39 is bonded to an inner peripheral surface of the outer lower inclined portion 97 in a face-to-face contact. The outer lower inclined surface 98 is inclined to the inner peripheral side from a lower part toward an upper part thereof. The radial width of the inner lower permanent magnet 33 is set so as to become smaller from a lower part toward an upper part thereof. The outer lower inclined surface 98 serves as a second outer inclined surface. The outer lower inclined surface 98, inner lower inclined portion 93, outer lower inclined portion 97 and outer upper inclined surface 96 have the same inclination θ.

The following effects are achieved from the fourth embodiment. The inner yoke 31 is formed with the inner upper and lower inclined portions 91 and 93. The inner yoke 31 includes the boundary between the inner upper and lower permanent magnets 32 and 33. Magnetic flux concentrates on the boundary. The boundary has a larger radial dimension or width than the remaining portion. Consequently, the magnetic saturation can be prevented from occurring in the inner yoke 31 while an increase in the weight of the inner yoke 31 is restrained. Moreover, the inner upper inclined surface 92 is formed on the inner upper permanent magnet 32 and the inner lower inclined surface 94 of the inner lower permanent magnet 33. Accordingly, when the inner upper inclined portion 91 of the inner yoke 31 and the inner lower inclined surface 94 of the inner lower permanent magnet 33 are caused to be in face-to-face contact with each other, the inner upper permanent magnet 32 can be fixed to a target position of the inner yoke 31. When the inner lower inclined portion 93 of the inner 91 have the same inclination θ.

The outer yoke 37 is formed with an outer upper inclined portion 95 serving as a first outer inclined portion as shown in FIG. 11. The outer upper inclined portion 95 has a radial width increased from an upper part toward a lower part thereof. The outer upper inclined portion 95 has an outer diameter set so as to be increased from the upper part toward the lower part and so as to be minimum at a contact surface between the outer upper inclined portion 38 and the outer spacer 40. The outer upper inclined portion 95 has an inner peripheral surface to which an outer upper inclined surface 96 of the outer upper permanent magnet 38 is bonded in a face-to-face contact. The outer upper inclined surface 96 is inclined toward the inner peripheral side from an upper part toward a lower part thereof. The radial width of the outer upper permanent magnet 38 is set so as to become smaller from an upper part toward a lower part thereof. The outer upper inclined surface 96 serves as a first outer inclined surface.

The outer yoke 37 is formed with an outer lower inclined portion 97 serving as a second outer inclined portion as shown in FIG. 11. The outer lower inclined portion 97 has a radial width increased from a lower part toward an upper part thereof. The outer lower inclined portion 97 is a portion having a radial width is increased from a lower part toward an upper part thereof and has an inner diameter set so as to be increased from the lower part toward the upper part thereof and so as to be minimum at a contact surface between the outer lower permanent magnet 39 and the outer spacer 40. An outer lower inclined surface 98 of yoke 31 and the inner lower inclined surface 94 of the inner lower permanent magnet 33 are caused to be in a face-to-face contact with each other, the inner lower permanent magnet 33 can be fixed to the target position. Consequently, the positioning efficiency can be improved for the inner yoke 31 of the inner upper and lower permanent magnets 32 and 33.

The outer upper and lower inclined portions 95 and 97 are formed on the outer yoke 37. The outer yoke 37 is formed with the outer upper and lower inclined portions 95 and 97. The outer yoke 37 includes the boundary between the outer upper and lower permanent magnets 38 and 39. Magnetic flux concentrates on the boundary. The boundary has a larger radial dimension or thickness than the remaining portion. Consequently, the magnetic saturation can be prevented from occurring in the inner yoke 31 while an increase in the weight of the outer yoke 37 is restrained.

Moreover, the outer upper inclined surface 96 is formed on the outer upper permanent magnet 38 and the outer lower inclined surface 98 of the outer lower permanent magnet 39. Accordingly, when the outer upper inclined portion 95 of the outer yoke 37 and the outer upper inclined surface 96 of the outer upper permanent magnet 33 are caused to be in face-to-face contact with each other, the outer upper permanent magnet 33 can be fixed to a target position of the outer yoke 37. When the inner lower inclined portion 97 of the outer yoke 37 and the outer lower inclined surface 98 of the outer lower permanent magnet 39 are caused to be in a face-to-face contact with each other, the outer lower permanent magnet 33 can be fixed to the target position. Consequently, the positioning efficiency can be improved for the inner yoke 31 of the outer upper and lower permanent magnets 38 and 39.

FIG. 12 shows the results of computation of maximum thrust and weight in the case where the width Ta of the lower end of the inner upper permanent magnet 32 fixed to 1.0 and the width Tb of the upper end of the inner upper permanent magnet 32 and the width Tb of the lower end of the inner lower permanent magnet 33 are changed in common. As obvious from FIG. 12, the maximum thrust is increased with increase in both widths Tb. Accordingly, it is preferable that both widths Tb are larger for improvement in the maximum thrust. When both widths Tb are larger, the inclinations θ of the inner inclined surface 92 of the inner upper permanent magnet 32 and the inner lower inclined surface 94 of the inner lower permanent magnet 33 are also increased. Consequently, production of the inner upper and lower permanent magnets would become difficult. Moreover, since the weight of each of the inner upper and lower permanent magnets is increased when both widths Tb take larger values respectively, both widths Tb are set in the range of $1.0 < Tb \leq 1.7$ in view of balance among the maximum thrust, production efficiency and weight.

The inner and outer yokes 31 and 37 may be made of a magnetic material such as ferrite, ferritic stainless steel, martensitic iron or martensitic stainless steel in the first to fourth embodiments.

The bobbin 51 may be made from an insulating synthetic resin such as polyetheretherketone (PEEK) resin in the first to fourth embodiments.

The inner upper and lower permanent magnets 32 and 33 may be spaced away from each other by a distance larger than a half of each of the radial width of the inner upper permanent magnet 32 and radial width of the inner lower permanent magnet 33.

The outer upper permanent magnet 38 and the outer lower permanent magnet may be spaced away from each other by a distance larger than a half of each of the radial widths of the outer upper and lower permanent magnets 38 and 39.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A linear actuator comprising:
    a cylindrical inner yoke made of a magnetic material and having an outer peripheral surface;
        a first cylindrical inner permanent magnet joined to the outer peripheral surface of the inner yoke and including an inner peripheral portion which is magnetized so as to have one of north and south poles and an outer peripheral portion which is magnetized so as to have the other pole, the first inner permanent magnet having an outer diameter and an outer peripheral surface;
        a second cylindrical inner permanent magnet joined to the outer peripheral surface of the inner yoke so as to be spaced away from the first inner permanent magnet and including inner and outer peripheral portions which are magnetized so as to have polarities opposite to polarities of the inner and outer peripheral portions of the first inner permanent magnet respectively, the second inner permanent magnet having an outer diameter;
        an outer yoke made of a magnetic material and formed into such a cylindrical shape that the outer yoke has an inner diameter larger than the outer diameters of the first and second inner permanent magnets, the outer yoke being disposed on the outer peripheral portions of the first and second inner permanent magnets, the outer yoke having an inner peripheral surface;
        an interconnecting member interconnecting the outer and inner yokes so that the inner peripheral surface of the outer yoke is radially opposed to the outer peripheral surfaces of the first and second inner permanent magnets;
        a first outer permanent magnet joined to the inner peripheral surface of the outer yoke with a first gap being defined between the first inner and outer permanent magnets and formed into such a cylindrical shape that the first outer permanent magnet is radially opposed to the outer peripheral surface of the first inner permanent magnet, the first outer permanent magnet including inner and outer peripheral portions both of which are magnetized so as to have the same polarity as the inner and outer peripheral portions of the first inner permanent magnet respectively;
        a second outer permanent magnet joined to the inner peripheral surface of the outer yoke so as to be axially spaced away from the first outer permanent magnet, the second outer permanent magnet being formed into such a cylindrical shape as to be radially opposed to the outer peripheral surface of the second inner permanent magnet with a second gap therebetween;
        a first armature coil made by winding a magnet wire into a cylindrical shape and inserted into the first gap so as to be axially movable; and
        a second armature coil made by winding a magnet wire into a cylindrical shape and inserted into the second gap so as to be axially movable, the second armature coil being mechanically connected to the first armature coil,
    wherein the inner yoke includes an inner thicker portion axially opposed to the first and second inner permanent magnets and having a larger radial thickness than a remaining portion of the inner yoke, and the outer yoke includes an outer thicker portion axially opposed to the first and second outer permanent magnets and having a larger radial thickness than a remaining portion of the outer yoke.

2. A linear actuator comprising:
    a cylindrical inner yoke made of a magnetic material and having an outer peripheral surface;
    a first cylindrical inner permanent magnet joined to the outer peripheral surface of the inner yoke and including an inner peripheral portion which is magnetized so as to have one of north and south poles and an outer peripheral portion which is magnetized so as to have the other pole, the first inner permanent magnet having an outer diameter and an outer peripheral surface;
    a second cylindrical inner permanent magnet joined to the outer peripheral surface of the inner yoke so as to be spaced away from the first inner permanent magnet and including inner and outer peripheral portions which are magnetized so as to have polarities opposite to polarities of the inner and outer peripheral portions of the first inner permanent magnet respectively, the second inner permanent magnet having an outer diameter;
    an outer yoke made of a magnetic material and formed into such a cylindrical shape that the outer yoke has an inner diameter larger than the outer diameters of the first and second inner permanent magnets, the outer yoke being disposed on the outer peripheral portions of the first and second inner permanent magnets, the outer yoke having an inner peripheral surface;
    an interconnecting member interconnecting the outer and inner yokes so that the inner peripheral surface of the outer yoke is radially opposed to the outer peripheral surfaces of the first and second inner permanent magnets;

a first outer permanent magnet joined to the inner peripheral surface of the outer yoke with a first gap being defined between the first inner and outer permanent magnets and formed into such a cylindrical shape that the first outer permanent magnet is radially opposed to the outer peripheral surface of the first inner permanent magnet, the first outer permanent magnet including inner and outer peripheral portions both of which are magnetized so as to have the same polarity as the inner and outer peripheral portions of the first inner permanent magnet respectively;

a second outer permanent magnet joined to the inner peripheral surface of the outer yoke so as to be axially spaced away from the first outer permanent magnet, the second outer permanent magnet being formed into such a cylindrical shape as to be radially opposed to the outer peripheral surface of the second inner permanent magnet with a second gap therebetween;

a first armature coil made by winding a magnet wire into a cylindrical shape and inserted into the first gap so as to be axially movable; and a second armature coil made by winding a magnet wire into a cylindrical shape and inserted into the second gap so as to be axially movable, the second armature coil being mechanically connected to the first armature coil, wherein the inner yoke includes a first inner inclined portion provided therein so as to be radially opposed to the first inner permanent magnet and having a radial thickness increased from one of two ends of the first inner permanent magnet toward the other end of the first inner permanent magnet, said one end of the first inner permanent magnet being opposed to the second inner permanent magnet, said other end of the first inner permanent magnet being located at the same side as the second inner permanent magnet, the first inner inclined portion having an outer peripheral surface, and a second inner inclined portion provided therein so as to be radially opposed to the second inner permanent magnet and having a radial thickness decreased from one of two ends of the second inner permanent magnet toward the other end of the first inner permanent magnet, said one end of the second inner permanent magnet being located at the same side as the first inner permanent magnet, said other end of the second inner permanent magnet being opposed to the first Inner permanent magnet;

the first inner permanent magnet includes a first inner inclined surface joined to the outer peripheral surface of the first inner inclined portion in a plane contact;

the second inner permanent magnet includes a second inner inclined surface joined to the outer peripheral surface of the second inner inclined portion in a plane contact;

the outer yoke includes a first outer inclined portion provided therein so as to be radially opposed to the first outer permanent magnet and having a radial thickness increased from one of two ends of the first outer permanent magnet toward the other end of the first outer permanent magnet, said one end of the first outer permanent magnet being opposed to the second outer permanent magnet, said other end of the first outer permanent magnet being located at the same side as the second outer permanent magnet, the first outer inclined portion having an outer peripheral surface, and a second outer inclined portion provided therein so as to be radially opposed to the second outer permanent magnet and having a radial thickness decreased from one of two ends of the second outer permanent magnet toward the other end of the first outer permanent magnet, said one end of the second outer permanent magnet being located at the same side as the first outer permanent magnet, said other end of the second outer permanent magnet being opposed to the first outer permanent magnet;

the first outer permanent magnet includes a first outer inclined surface joined to the inner peripheral surface of the first outer inclined portion in a plane contact; and the second outer permanent magnet includes a second outer inclined surface joined to the outer peripheral surface of the second outer inclined portion in a plane contact.

3. The linear actuator according to claim 1, which is provided in a component supporting apparatus including:
   a supporting member for supporting a component;
   a transfer mechanism transferring the supporting member to a thrust position opposed to the component; and
   an operating mechanism thrusting the supporting member into the component based on movement of the supporting member from the thrust position toward the component, the linear actuator being incorporated in the component supporting apparatus to apply to the supporting member a thrust downwardly directed from the thrust position.

4. The linear actuator according to claim 1, which is provided in a die bonder including:
   an adsorption nozzle adsorbing a semiconductor chip and thrusting the semiconductor chip into a lead frame;
   a transfer mechanism transferring the adsorption nozzle between a first thrust position opposed to the semiconductor chip and a second thrust position opposed to the lead frame; and
   an operating mechanism thrusting the adsorption nozzle into the semiconductor chip based on movement of the semiconductor chip from the first thrust position toward the semiconductor chip and thrusting the semiconductor chip adsorbed by the adsorption nozzle from the second thrust position into the lead frame, the linear actuator being incorporated in the die bonder to apply to the adsorption nozzle a thrust directed from the first thrust position toward the semiconductor chip and a thrust directed from the second thrust position toward the lead frame.

5. The linear actuator according to claim 2, which is provided in a component supporting apparatus including:
   a supporting member for supporting a component;
   a transfer mechanism transferring the supporting member to a thrust position opposed to the component; and
   an operating mechanism thrusting the supporting member into the component based on movement of the supporting member from the thrust position toward the component, the linear actuator being incorporated in the component supporting apparatus to apply to the supporting member a thrust downwardly directed from the thrust position.

6. The linear actuator according to claim 2, which is provided in a die bonder including:
   an adsorption nozzle adsorbing a semiconductor chip and thrusting the semiconductor chip into a lead frame;
   a transfer mechanism transferring the adsorption nozzle between a first thrust position opposed to the semiconductor chip and a second thrust position opposed to the lead frame; and an operating mechanism thrusting the adsorption nozzle into the semiconductor chip based on movement of the semiconductor chip from the first thrust position toward the semiconductor chip and thrusting the semiconductor chip adsorbed by the adsorption nozzle from the second thrust position into the lead frame, the linear actuator being incorporated in the die bonder to apply to the adsorption nozzle a thrust directed from the first thrust position toward the semiconductor chip and a thrust directed from the second thrust position toward the lead frame.

* * * * *